United States Patent [19]
Kalnitsky et al.

[11] Patent Number: 6,087,211
[45] Date of Patent: Jul. 11, 2000

[54] METHOD FOR FORMING A SEMICONDUCTOR DEVICE HAVING NON-VOLATILE MEMORY CELLS, HIGH-VOLTAGE TRANSISTORS, AND LOW-VOLTAGE, DEEP SUB-MICRON TRANSISTORS

[75] Inventors: Alexander Kalnitsky, San Francisco; Albert Bergemont, Palo Alto, both of Calif.

[73] Assignee: National Semiconductor Corporation, Santa Clara, Calif.

[21] Appl. No.: 09/132,990

[22] Filed: Aug. 12, 1998

[51] Int. Cl.[7] .................... H01L 21/8238; H01L 21/336
[52] U.S. Cl. ................ 438/232; 438/201; 438/258; 438/264; 438/275
[58] Field of Search ..................... 438/232, 257, 438/258, 264, 263, 265, 266, 593, 594, 201, 275; 148/DIG. 203

[56] References Cited

U.S. PATENT DOCUMENTS

| | | | |
|---|---|---|---|
| 4,701,776 | 10/1987 | Perlegos et al. | 257/321 |
| 4,851,361 | 7/1989 | Schumann et al. | 438/201 |
| 5,591,658 | 1/1997 | Cacharelis | 438/264 |
| 5,872,034 | 2/1999 | Schlais et al. | 438/257 |
| 5,908,311 | 6/1999 | Chi et al. | 438/258 |

*Primary Examiner*—Michael Trinh
*Attorney, Agent, or Firm*—Limbach & Limbach L.L.P.

[57] ABSTRACT

A semiconductor device having memory cells, high-voltage CMOS transistors, and low-voltage, deep sub-micron CMOS transistors is formed in a process that allows the same low-voltage device parameters to be used regardless of whether the low-voltage transistors are formed with or without the memory cells and the high-voltage CMOS transistors.

12 Claims, 14 Drawing Sheets

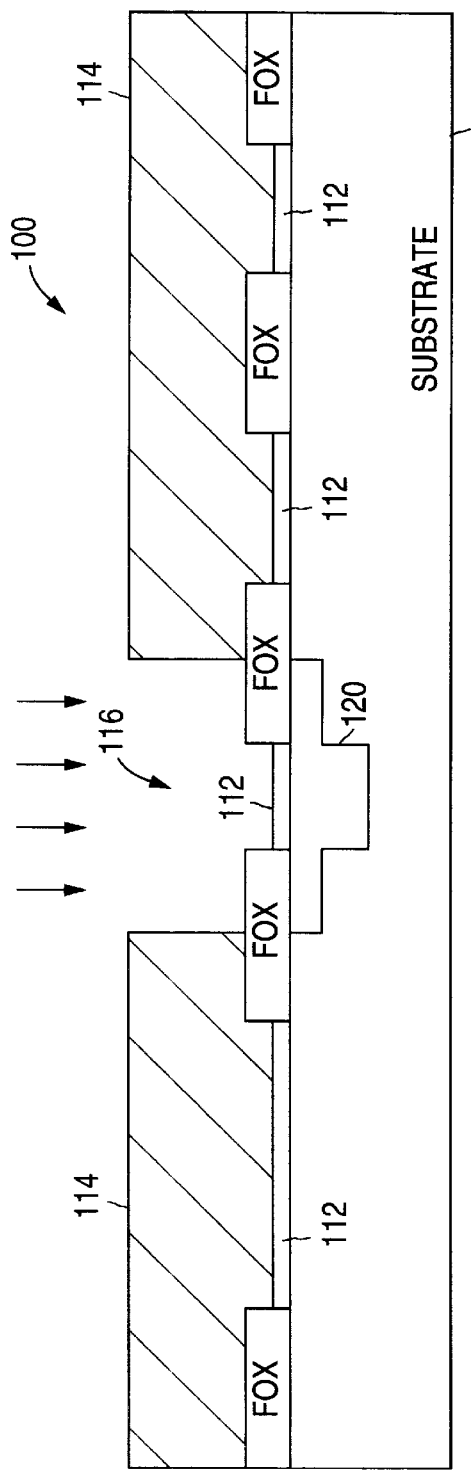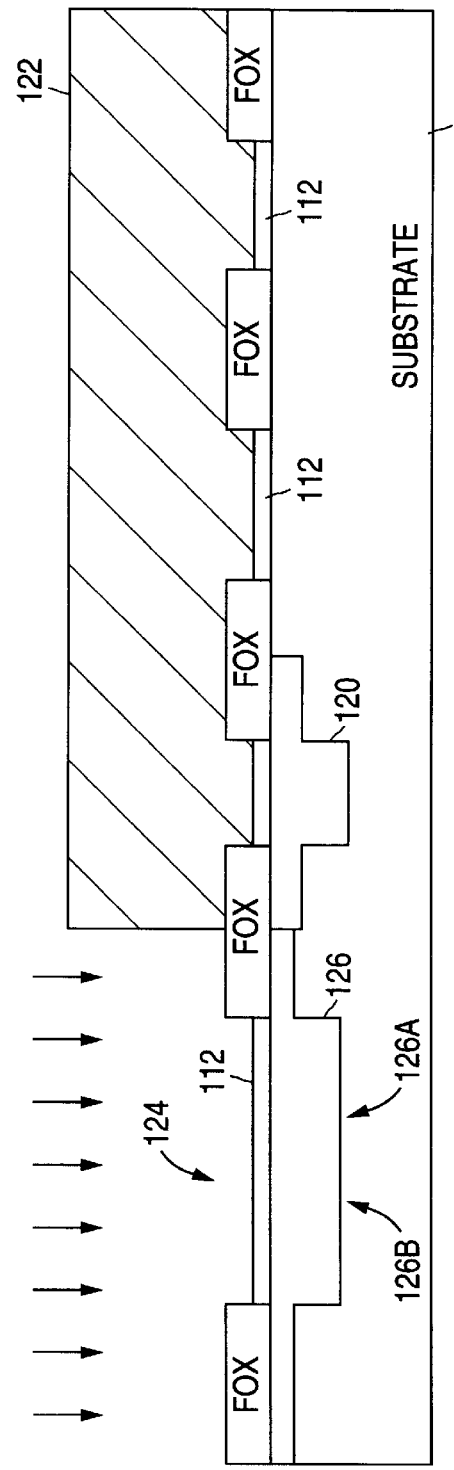

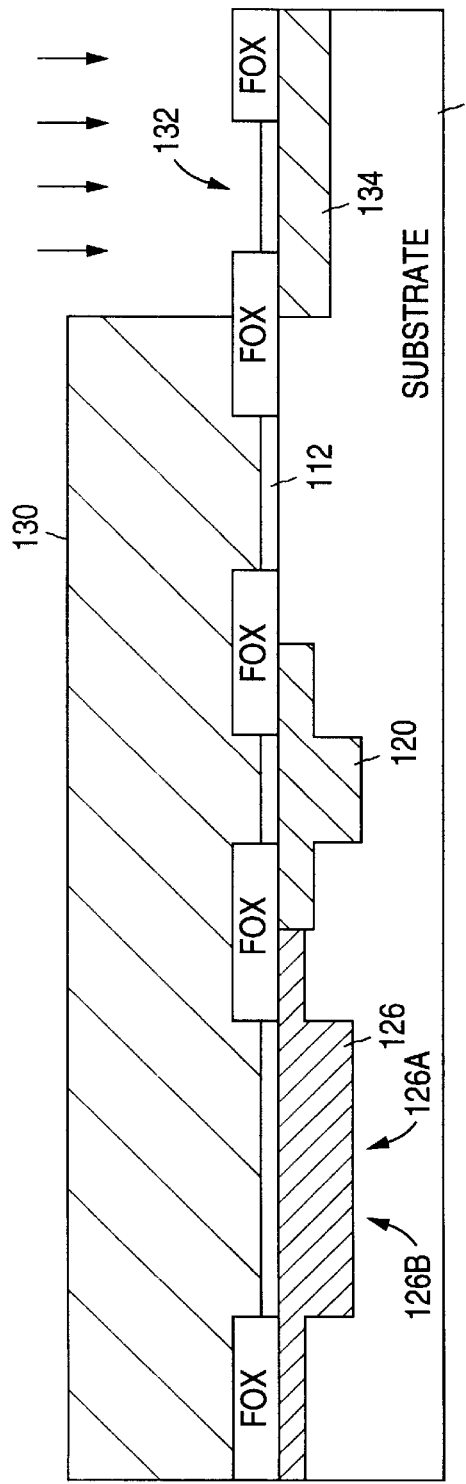
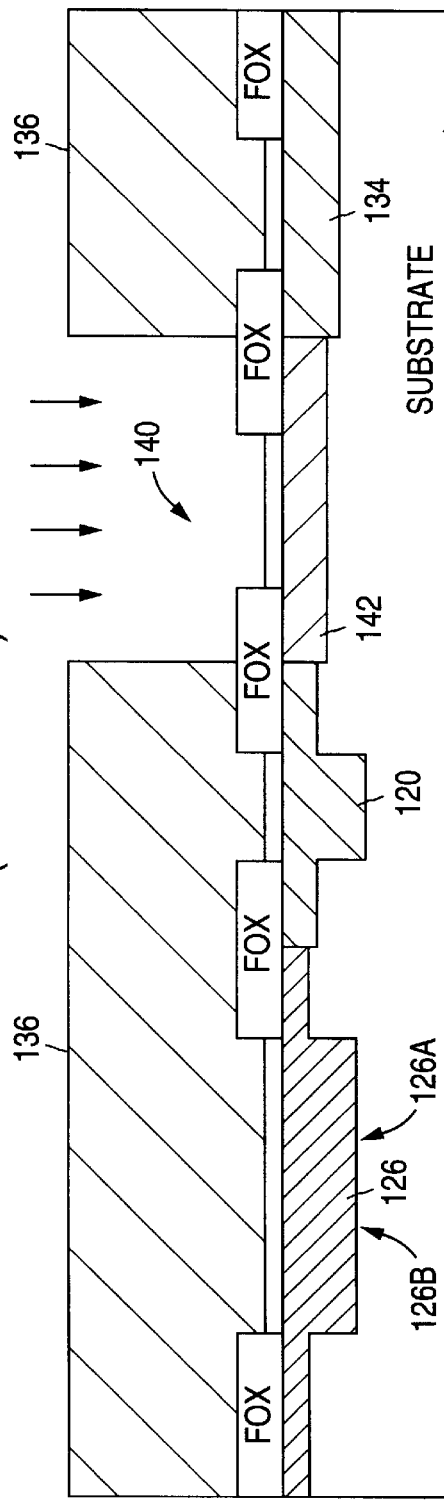
FIG. 1C (PRIOR ART)
FIG. 1D (PRIOR ART)

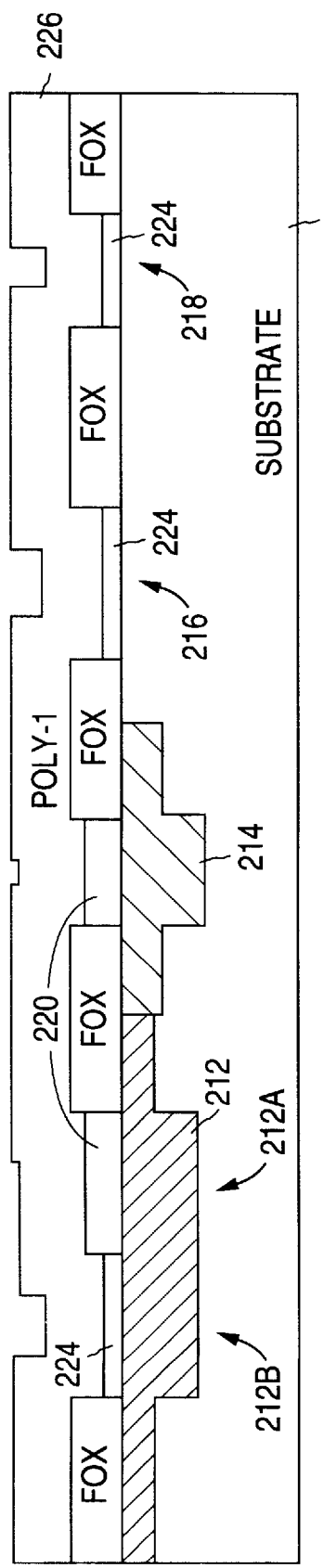
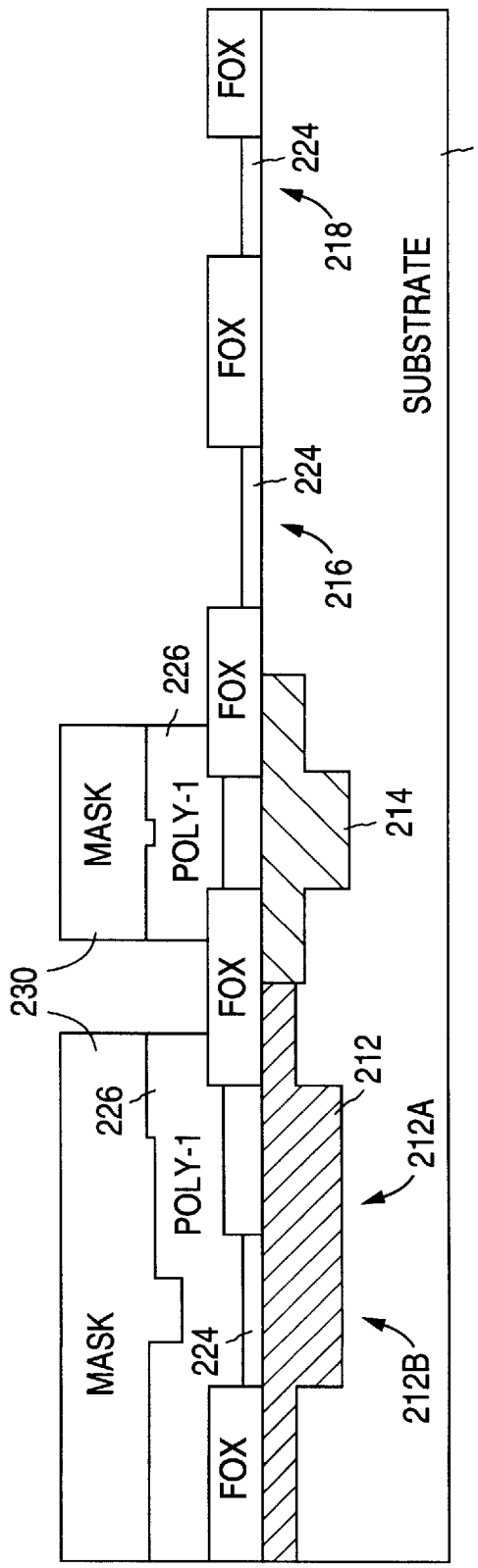
FIG. 2D
FIG. 2E

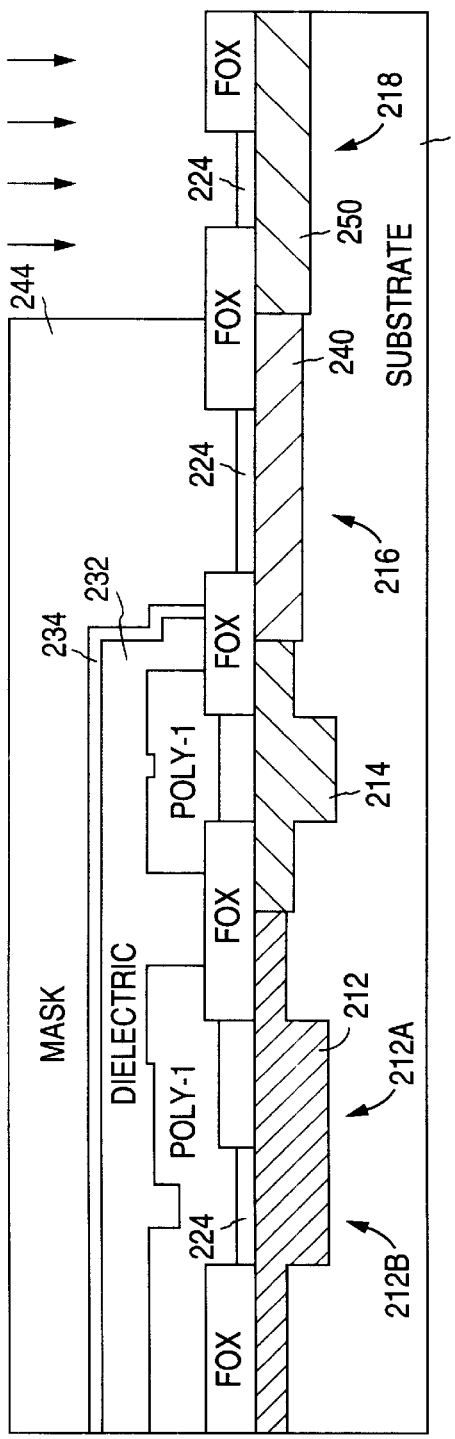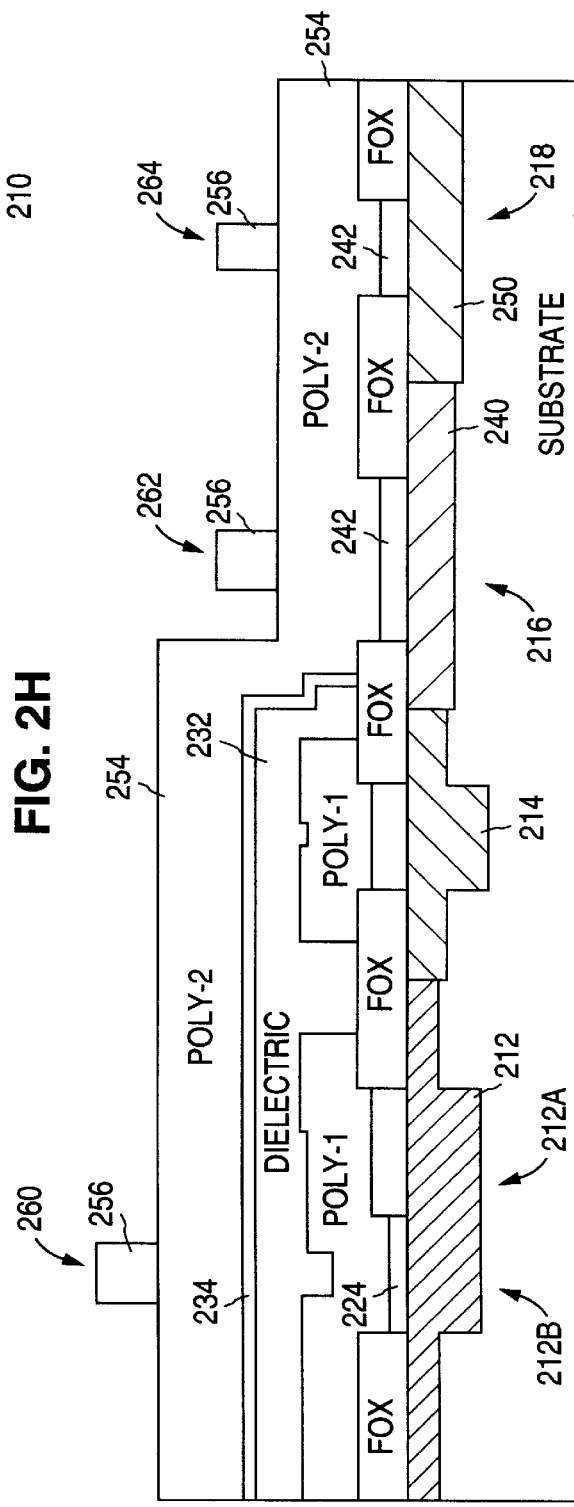

METHOD FOR FORMING A SEMICONDUCTOR DEVICE HAVING NON-VOLATILE MEMORY CELLS, HIGH-VOLTAGE TRANSISTORS, AND LOW-VOLTAGE, DEEP SUB-MICRON TRANSISTORS

BACKGROUND OF THE INVENTION

1. Field of the Invention

The present invention relates to a method for forming a semiconductor device and, more particularly, to a method for forming a semiconductor device that has non-volatile memory cells, high-voltage CMOS transistors, and low-voltage, deep sub-micron CMOS transistors on the same substrate.

2. Description of the Related Art

A non-volatile memory cell is a semiconductor device that stores information even after power has been removed from the device. Two of the most common types of non-volatile memory cells are electrically-erasable programmable read-only-memory (EEPROM) cells and flash memory cells.

EEPROM and flash memory cells are commonly formed on the same substrate as high-voltage CMOS transistors as both memory cell types are electrically programmed and erased with voltages that are typically much larger than the voltages required to read the cells.

In addition, although less common, EEPROM and flash memory cells, along with the high-voltage transistors, are also formed on the same substrate as low-voltage, deep sub-micron (e.g., 0.25 microns and below) CMOS logic transistors.

One problem with forming non-volatile memory cells, high-voltage CMOS transistors, and low-voltage, deep sub-micron CMOS logic transistors on the same substrate is that two sets of low-voltage device parameters must be maintained if a logic circuit, which is formed from the low-voltage logic transistors, is to be formed both with and without the non-volatile memory cells.

The two sets of parameters must be maintained because in one case the logic circuit is formed in a low-voltage CMOS process while, in the other case, the logic circuit is formed in a hybrid process which must also accommodate the fabrication requirements of the memory cells and the high-voltage transistors.

FIGS. 1A–1J show cross-sectional drawings that illustrate a conventional process for forming a non-volatile memory cell, high-voltage CMOS transistors, and low-voltage, deep sub-micron CMOS transistors on the same substrate.

As shown in FIG. 1A, the process begins with a wafer 100 which is conventionally formed to have a substrate 110, spaced-apart field oxide regions FOX which are formed in substrate 110, and a layer of sacrificial oxide 112 which is formed on the top surface of substrate 110 between the field oxide regions FOX.

With wafer 100, the process continues by forming and patterning a first implant mask 114 on the surface of wafer 100 which defines a high-voltage n-well region 116. Once mask 114 has been formed, region 116 of wafer 100 is implanted with a n-type dopant, such as phosphorous, to form a high-voltage n-well 120. The implant energy and dose of a phosphorous implant for a high-voltage n-well are typically in the range of 120 to 400 KeV and $1\times10^{11}$ to $1\times10^{13}$ atoms/cm$^2$.

Following the formation of n-well 120, a n-type dopant, such as phosphorous, is implanted into n-well 120 to form a punchthrough prevention region (not shown) below the surface of n-well 120. The implant energy and dose of a phosphorous punchthrough implant are typically in the range of 20 to 90 KeV and $1\times10^{11}$ to $1\times10^{13}$ atoms/cm$^2$.

Next, a n or p-type dopant (depending on the poly doping type) is implanted into n-well 120 to set the threshold voltages of the to-be-formed high-voltage p-channel transistors. The implant energy and dose of a boron threshold voltage implant are typically in the range of 10 to 30 KeV and $1\times10^{11}$ to $1\times10^{13}$ atoms/cm$^2$. Once the threshold voltages of the high-voltage p-channel transistors have been set, first implant mask 114 is removed. The photoresist strip may be followed by an optional n-well thermal drive-in step.

After this, as shown in FIG. 1B, a second implant mask 122 is formed and patterned on the surface of wafer 100 to define a p-well region 124. Once mask 122 has been formed, region 124 is implanted with a p-type dopant to form a high-voltage p-well 126. P-well 126, in turn, includes a high-voltage region 126A and an array region 126B. The implant energy and dose of a boron implant for a high-voltage p-well are typically in the range of 90 to 250 KeV and $1\times10^{11}$ to $1\times10^{13}$ atoms/cm$^2$.

Following the formation of p-well 126, a p-type dopant is implanted into p-well 126 to form a punchthrough prevention region (not shown) below the surface of p-well 126. The implant energy and dose of a boron punchthrough implant are typically in the range of 70 to 150 KeV and $1\times10^{11}$ to $1\times10^{13}$ atoms/cm$^2$.

Next, a p-type dopant is again implanted into p-well 126 to set the threshold voltages of the to-be-formed high-voltage n-channel transistors. The implant energy and dose of a boron threshold voltage implant are typically in the range of 10 to 60 KeV and $1\times10^{11}$ to $1\times10^{13}$ atoms/cm$^2$. Once the threshold voltages of the high-voltage n-channel transistors have been set, second implant mask 122 is removed. The photoresist strip may be followed by an optional p-well thermal drive-in step.

Following this, as shown in FIGS. 1C–1D, the same sequence of events is generally repeated to form a plurality of low-voltage wells. Specifically, as shown in FIG. 1C, a third implant mask 130 is formed and patterned to define a low-voltage n-well region 132 on the surface of wafer 100. Once mask 130 has been formed, region 132 of wafer 100 is implanted with a n-type dopant to form a low-voltage n-well 134. The implant energy and dose are typically the same as those used to form n-well 120.

Following the formation of n-well 134, a n-type dopant is optionally implanted into n-well 134 to form a punchthrough prevention region (not shown) below the surface of n-well 134. The implant energy and dose are typically the same as those used with the high voltage devices.

Next, a n-type dopant is again implanted into n-well 134 to set the threshold voltages of the to-be-formed low-voltage p-channel transistors. The implant energy and dose are typically the same as those used with the high voltage devices. Once the threshold voltages of the low-voltage p-channel transistors have been set, third implant mask 130 is removed. The photoresist strip may be followed by an optional n-well thermal drive-in step.

Next, as shown in FIG. 1D, a fourth implant mask 136 is formed and patterned on the surface of wafer 100 to define a low-voltage p-well region 140. Once mask 136 has been formed, region 140 is implanted with a p-type dopant to form a low-voltage p-well 142. The implant energy and dose are typically the same as those used to form p-well 126.

Following the formation of p-well 142, a p-type dopant is optionally implanted into p-well 142 to form a punchthrough prevention region (not shown) below the surface of p-well 142. The implant energy and dose are typically the same as those used with the high voltage implants.

Next, a p-type dopant is again implanted into p-well 142 to set the threshold voltages of the to-be-formed low-voltage n-channel transistors. The implant energy and dose are typically the same as those used with the high voltage implants. Once the threshold voltages of the low-voltage n-channel transistors have been set, fourth implant mask 136 is removed. The photoresist strip may be followed by an optional p-well thermal drive-in step.

Following this, as shown in FIG. 1E, sacrificial oxide layer 112 is removed. This is followed by the growth of a layer of high-voltage gate oxide 144 on n-well 120, p-well 126, n-well 134, and p-well 142. High-voltage gate oxide layer 144 is formed to be about one-half to two-thirds of its final thickness.

Once gate oxide layer 144 has been formed, a first protect mask 146 is formed and patterned to protect n-well 120 and high-voltage region 126A of p-well 126. Following this, the unmasked regions of gate oxide layer 144 are removed to expose the surface of substrate 110.

After this, as shown in FIG. 1F, protect mask 146 is stripped. Following this, a layer of tunnel oxide 150 is grown on array region 126B, n-well 134, and p-well 142. The formation of tunnel oxide layer 150 also causes high voltage gate oxide layer 144 to increase to its final thickness.

Next, a layer of polysilicon (poly-1) 152 is formed on field oxide region FOX, gate oxide layer 144, and tunnel oxide layer 150. Poly-1 layer 152, which is utilized to form the floating gates of the memory transistors and the gates of the high-voltage transistors, is then doped. After poly-1 layer 152 has been deposited and doped, a second protect mask 154 is formed to cover n-well 120 and p-well 126, and expose n-well 134 and p-well 142.

Following this, as shown in FIG. 1G, the unmasked portions of poly-1 layer 152 are removed to expose the surface of the portion of tunnel oxide layer 150 which is formed over n-well 134 and p-well 142. Next, mask 154 is removed, and a layer of interpoly dielectric 156 is formed over the exposed field oxide regions FOX, the top surfaces of tunnel oxide layer 150, and poly-1 layer 152. Dielectric layer 156 is commonly formed from layers of oxide-nitride-oxide (ONO).

Next, a third protect mask 160 is formed to cover n-well 120 and p-well 126, and expose n-well 134 and p-well 142. Following this, as shown in FIG. 1H, the unmasked portions of dielectric layer 156 and tunnel oxide layer 150 are removed to expose the surface of n-well 134 and p-well 142. After this, mask 160 is removed.

To insure that all of the tunnel oxide layer 150 has been removed, wafer 100 is then cleaned. In addition to removing any remnants of tunnel oxide layer 150, the cleaning step also removes a portion of the top layer of oxide of interpoly dielectric layer 156. As a result, the top layer of oxide of interpoly dielectric layer 156 must be thick enough to allow a portion of the top layer of oxide to be removed.

Following this, a layer of gate oxide 162 is formed on n-well 134 and p-well 142. Once gate oxide layer 162 has been formed, a second layer of polysilicon (poly-2) 164 is formed on the exposed field oxide regions FOX, interpoly dielectric layer 156, and gate oxide layer 162. Poly-2 layer 164, which is utilized to form the control gates of the memory transistors and the gates of the low-voltage logic transistors, is then doped. (Optionally, poly-2 layer 164 may also be doped when the source and drain implants are performed).

Next, as shown in FIG. 1I, a first definition mask 166 is formed and patterned on poly-2 layer 164 to initially define a stacked-gate memory transistor 170, a n-channel low-voltage transistor 172, and a p-channel low-voltage transistor 174. Once mask 166 has been formed, the unmasked areas of poly-2 layer 164 are etched until poly-2 layer 164 has been removed.

After this, as shown in FIG. 1J, mask 166 is hardened, and a second definition mask 176 is formed and patterned on dielectric layer 156 to define a n-channel high-voltage transistor 180, and a p-channel high-voltage transistor 182. In addition, as further shown in FIG. 1J, mask 176 also covers the low-voltage portion of wafer 100.

Once mask 176 has been formed, the unmasked areas are etched until dielectric layer 156 and poly-1 layer 152 have been removed. After this, conventional steps are followed.

Thus, as shown in the above steps, low-voltage wells 134 and 142 go through a number of fabrication steps, such as the deposition and removal of poly-1 layer 152 and dielectric layer 156, and the growth of oxide layers 144 and 150, which would not be present is a process that did not form memory and high-voltage transistors. Unfortunately, these additional steps alter the device parameters.

Thus, there is a need for a method of forming a semiconductor device that has memory cells, high-voltage CMOS transistors, and low-voltage, sub-micron CMOS transistors such that the device parameters of the low-voltage transistors are the same regardless of whether the memory cells and high-voltage transistors are formed with the low-voltage transistors.

SUMMARY OF THE INVENTION

Logic circuits which utilize low-voltage, deep sub-micron CMOS transistors typically require two sets of device parameters: one for when the circuit is incorporated into a device that also has memory cells and high-voltage transistors; and one for when the circuit is not formed with the memory cells and high-voltage transistors.

The present invention eliminates the need for two sets of device parameters by forming the low-voltage transistors after many of the fabrication steps that are unique to the formation of the memory cells and high-voltage transistors have been completed.

The method of the present invention begins with a semiconductor wafer which has a substrate, and first and second wells that are formed in the substrate. The first well has a first area and a second area. The second well is spaced apart from the first well, and has a conductivity type which is different from the conductivity type of the first well.

The method continues with the step of forming a layer of gate oxide over the first area of the first well, and the second well. After this, a layer of tunnel oxide is formed over the second area of the first well. Next, a layer of first polysilicon (poly-1) is formed over the layer of tunnel oxide and the layer of gate oxide.

Next, a layer of interpoly dielectric is formed over the layer of poly-1. Following this, a layer of nitride is formed over the layer of interpoly dielectric. A third well is then formed in the substrate after the layer of nitride has been formed over the layer of interpoly dielectric. The third well is spaced apart from the first and second wells.

Next, a fourth well is formed in the substrate after the layer of nitride has been formed over the layer of interpoly dielectric. The fourth well is spaced apart from the first, second, and third wells, and has a conductivity type which is different from the conductivity type of the third well. After the fourth well has been formed, a layer of gate oxide is formed over the third and fourth wells.

Following this, a layer of second polysilicon (poly-2) is formed over the layer of nitride and the layers of gate oxide formed over the third and fourth wells.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 1A–1J are cross-sectional drawings illustrating a conventional process for forming a semiconductor device that has a memory cell, high-voltage CMOS transistors, and low-voltage, deep sub-micron CMOS transistors.

FIGS. 2A–2L are cross-sectional drawings illustrating a process for forming a non-volatile memory cell, high-voltage CMOS transistors, and low-voltage, deep sub-micron CMOS transistors in accordance with the present invention.

DETAILED DESCRIPTION

FIGS. 2A–2L show cross-sectional drawings that illustrate a process for forming a non-volatile memory cell, high-voltage CMOS transistors, and low-voltage, deep sub-micron CMOS transistors in accordance with the present invention.

As described in greater detail below, the process of the present invention allows low-voltage, deep sub-micron CMOS transistors to be formed with one set of device parameters regardless of whether the memory cells and high-voltage transistors are formed with the low-voltage transistors.

This is accomplished in the present invention by completing many of the fabrication steps that are unique to the formation of the memory cells and high-voltage transistors before the wells that support the low-voltage transistors are formed.

Figure 1E:
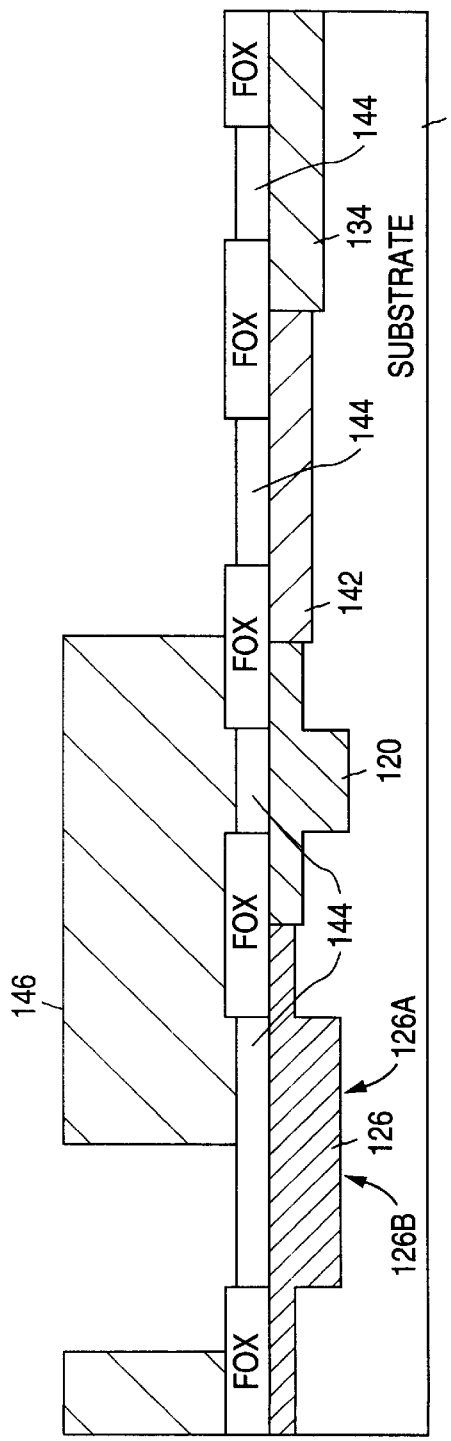
Figure 1F:
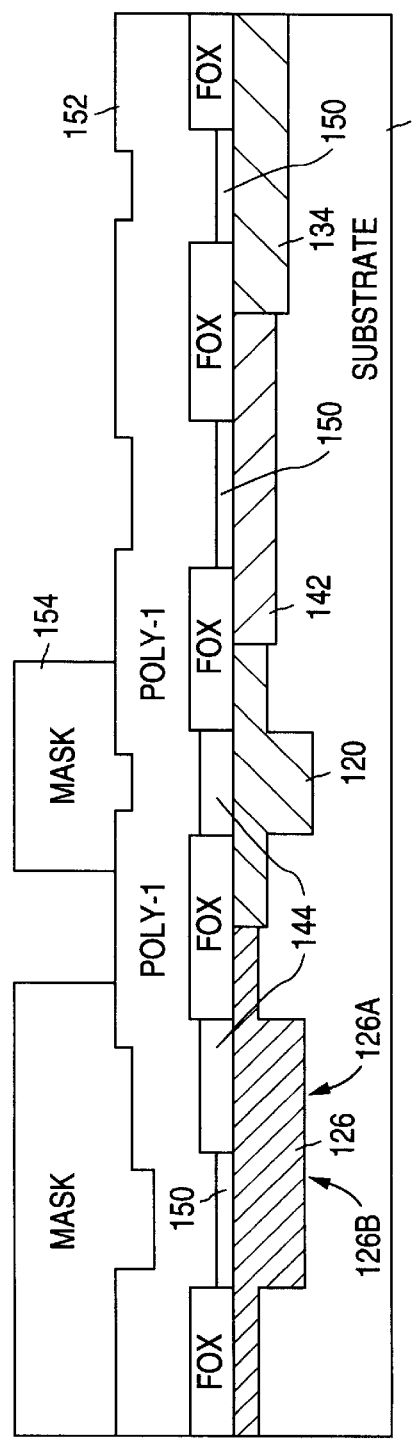
Figure 1G:
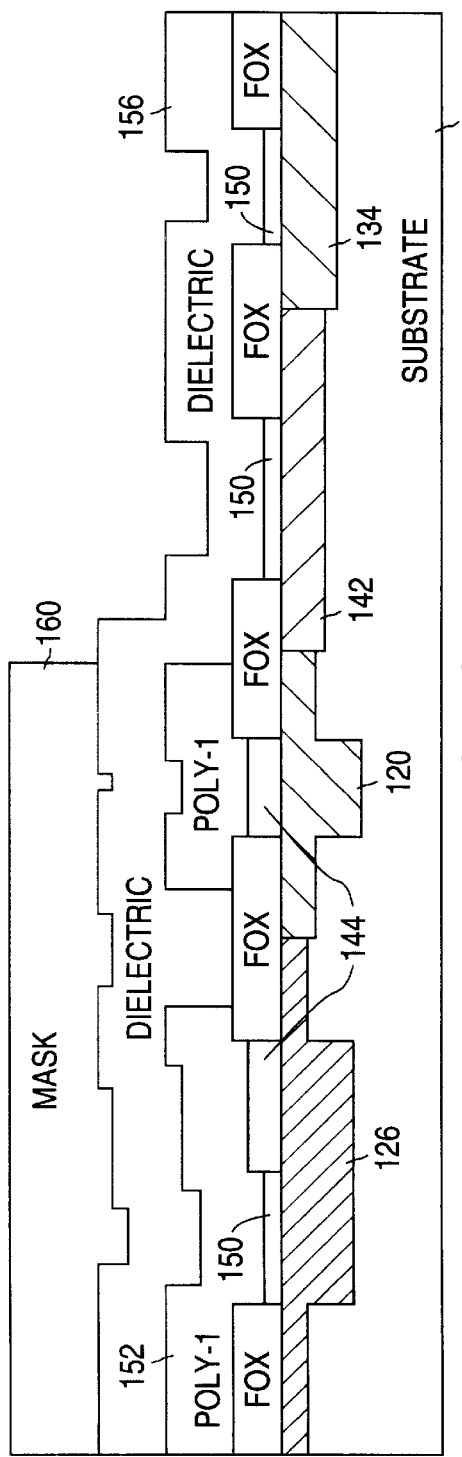
Figure 1H:
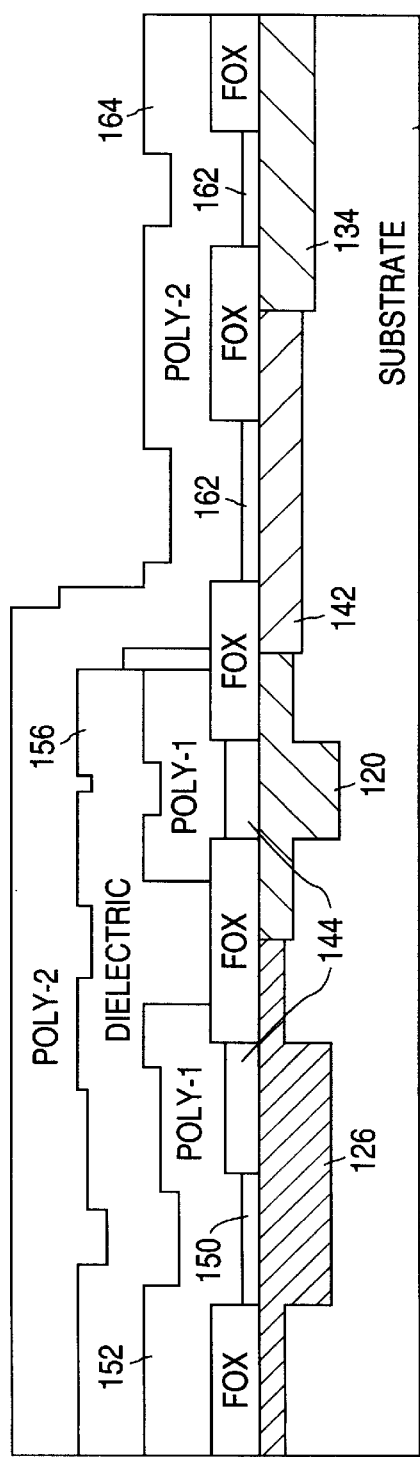
Figure 1I:
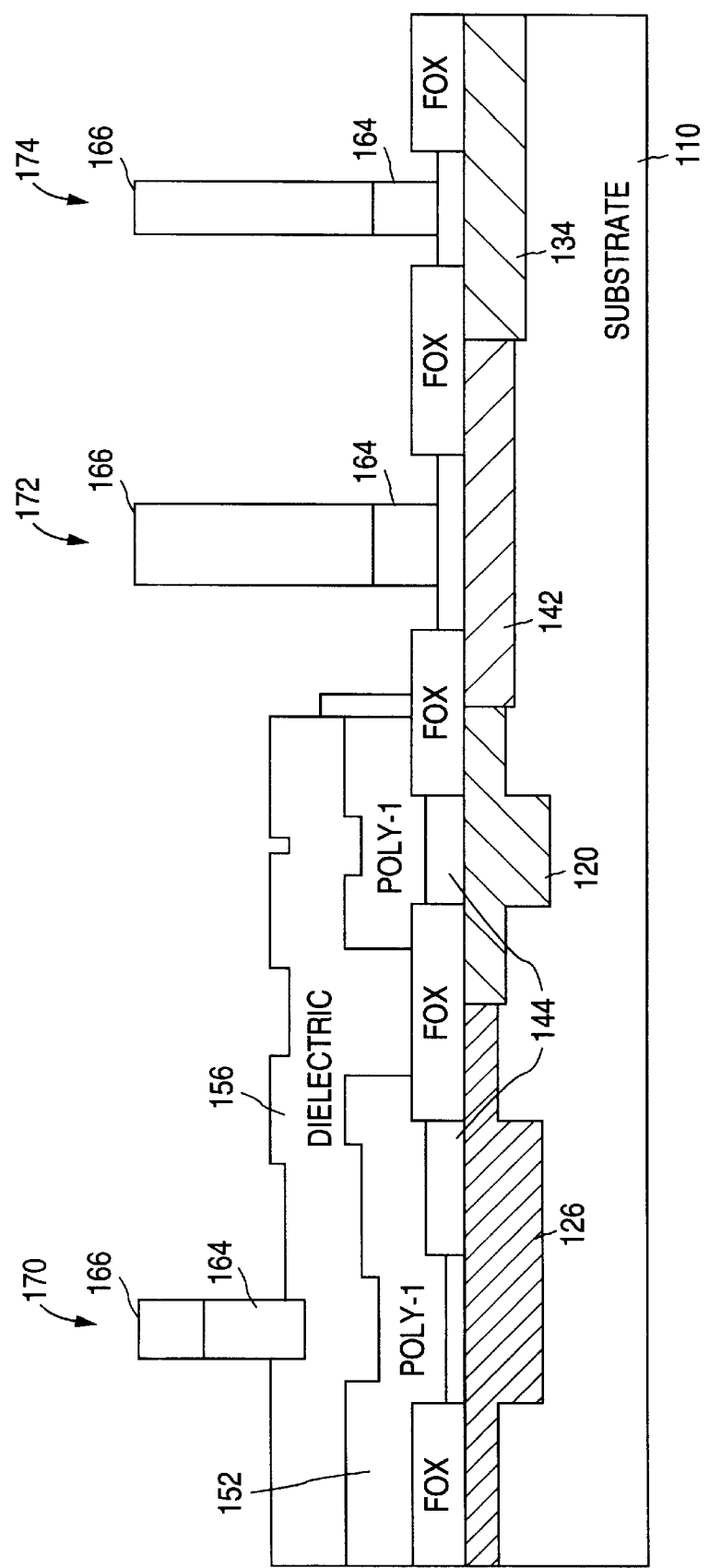
Figure 1J:
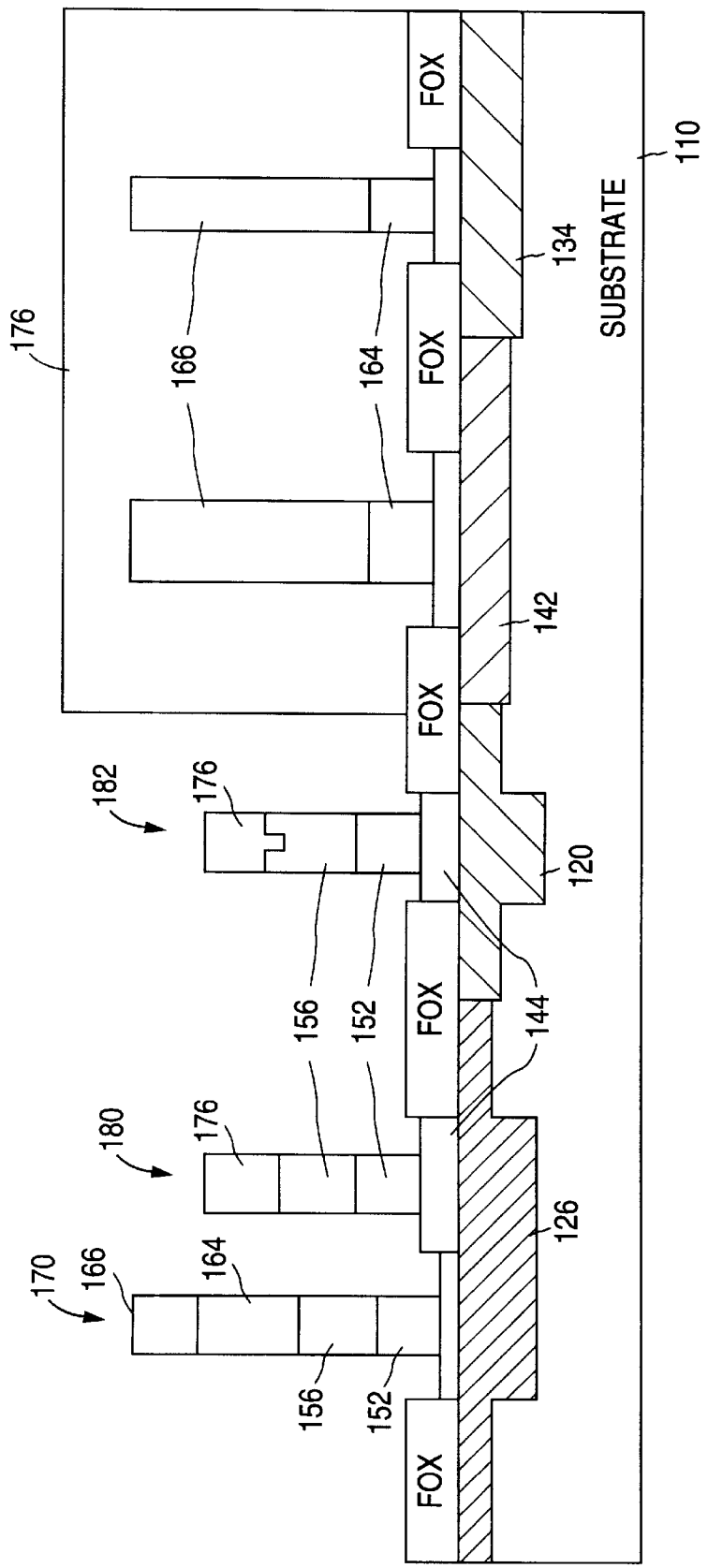
Figure 2A:
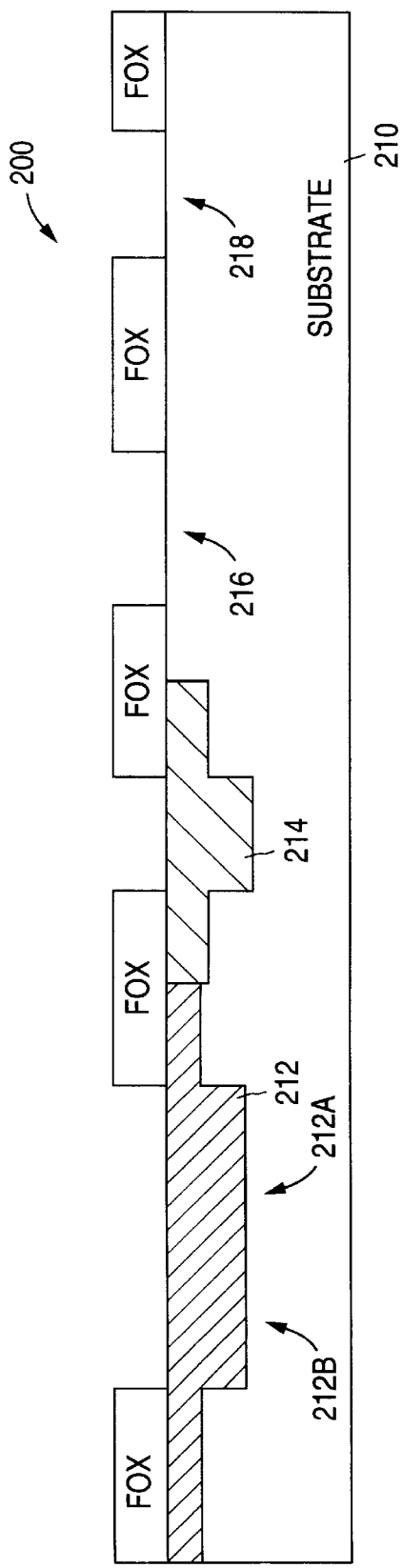

As shown in FIG. 2A, the process of the present invention, which is described with respect to a 0.25-micron photolithographic process, begins with a conventionally formed wafer 200 which includes a substrate 210, and a plurality of spaced-apart field oxide regions FOX that are formed in substrate 210.

In addition, wafer 200 also includes a p-well 212 which is formed in substrate 210 between a pair of adjacent field oxide regions FOX, and a n-well 214 which is also formed in substrate 210 between a pair of adjacent field oxide regions FOX. P-well 212, in turn, includes a high-voltage region 212A and an array region 212B.

As further shown in FIG. 2A, wafer 200 also includes a first substrate region 216 which is defined in substrate 210 between a pair of adjacent field oxide regions FOX, and a second substrate region 218 which is also defined in substrate 210 between a pair of adjacent field oxide regions FOX.

Figure 2B:
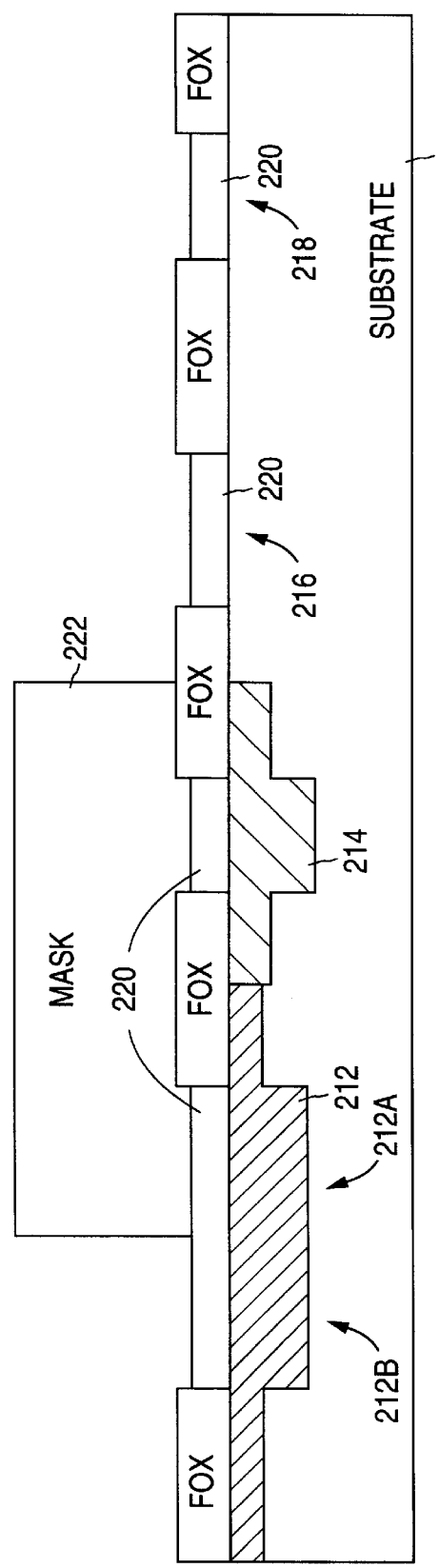

Next, as shown in FIG. 2B, the process continues with the formation of a first layer of gate oxide 220 approximately 50–200 Å thick on p-well 212, n-well 214, and the surface of substrate 210 in the first and second substrate regions 216 and 218.

Gate oxide layer 220 is formed to be about one-half to two-thirds of its final thickness. Once gate oxide layer 220 has been formed, a first protect mask 222 is formed and patterned to protect high-voltage region 212A and n-well 214.

Figure 2C:
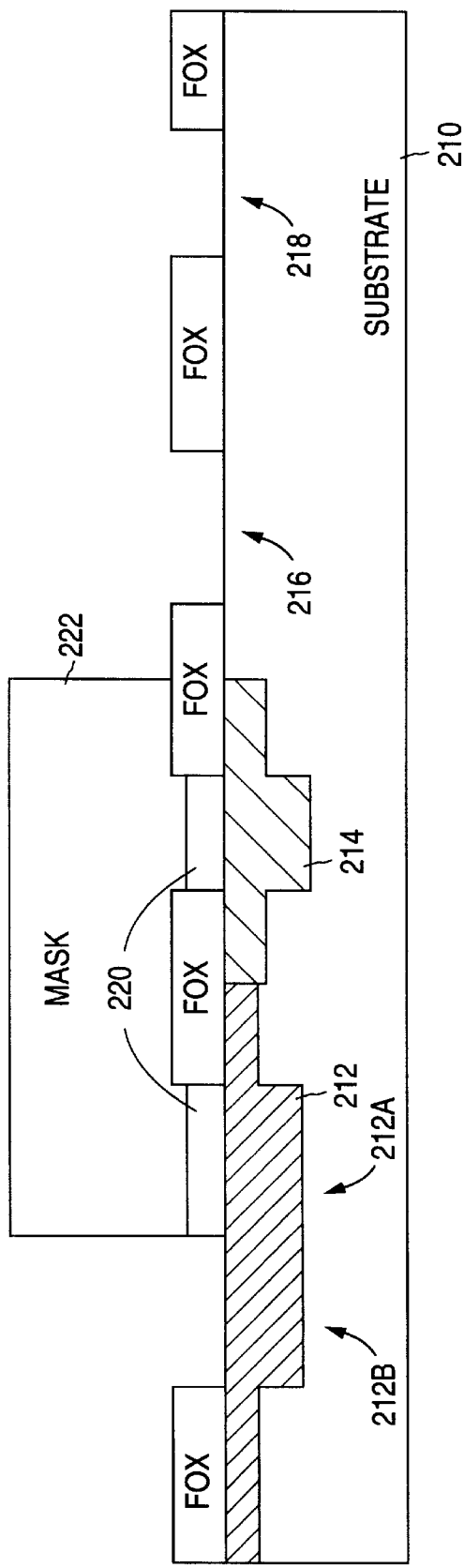

As shown in FIG. 2C, the unmasked regions of gate oxide layer 220 are then removed to expose the surface of array region 212B, and the surface of the first and second substrate regions 216 and 218. Gate oxide layer 220 may be etched with a single etch recipe that includes HF. Following this, protect mask 222 is stripped.

Next, as shown in FIG. 2D, a layer of tunnel oxide 224 approximately 80–120 Å thick is formed on the surface of array region 212B and the surface of the first and second substrate regions 216 and 218. Formation of tunnel oxide layer 224 also causes gate oxide layer 220 to increase to its final thickness.

Following this, a layer of polysilicon (poly-1) 226 approximately 1,000–5,000 Å thick is formed on the field oxide regions FOX, gate oxide layer 220, and tunnel oxide layer 224. Poly-1 layer 226, which is utilized to form the floating gates of the memory transistors and the gates of the high-voltage transistors, is then doped.

Next, as shown in FIG. 2E, once poly-1 layer 226 has been deposited and doped, a second protect mask 230 is formed on poly-1 layer 226 to cover p-well 212 and n-well 214. Next, the unmasked areas of poly-1 layer 226 are etched until the unmasked areas of poly-1 layer 226 have been removed. Poly-1 layer 226 may be etched with a single etch recipe that includes HBr, HBCl, and HCl, Mask 230 is then removed.

Figure 2F:
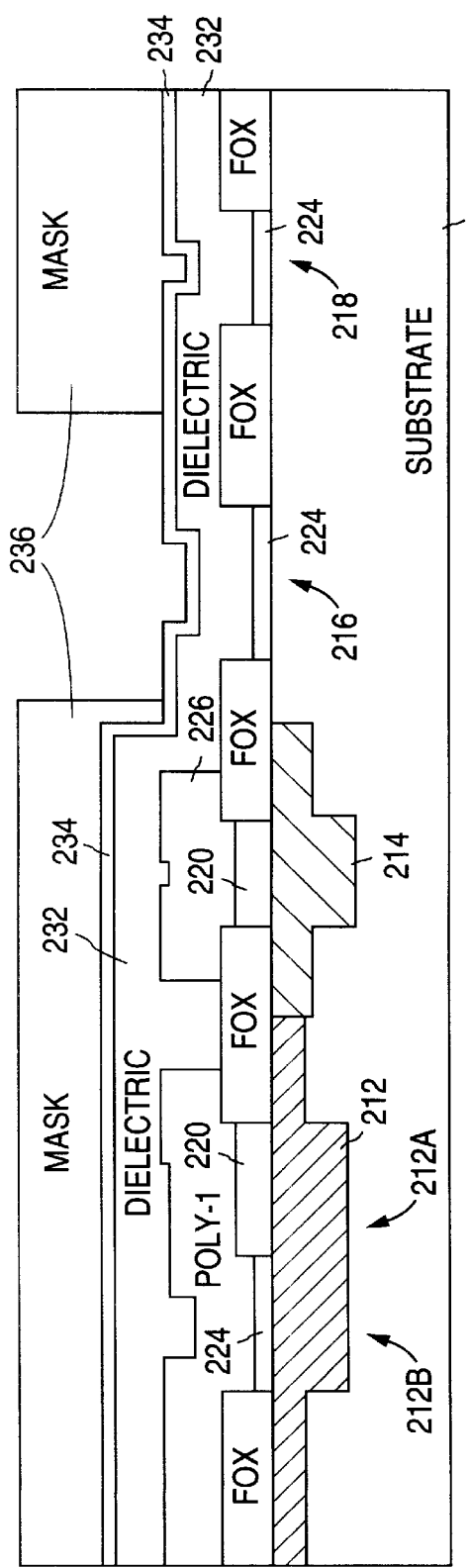

Following this, as shown in FIG. 2F, a layer of interpoly dielectric 232 approximately 200 Å thick (oxide equivalent) is formed on the exposed field oxide regions FOX, poly-1 layer 226, and the tunnel oxide layer 224 formed on the first and second substrate regions 216 and 218. Dielectric layer 232 is preferably formed from layers of oxide-nitride-oxide (ONO).

Next, in accordance with the present invention, a layer of nitride 234 approximately 50–100 Å thick is formed over dielectric layer 232. One of the advantages of the present invention is that nitride layer 234 allows for processing of the low-voltage devices after the high-temperature processing steps associated with the high-voltage devices has been completed. After nitride layer 234 has been formed, a first well mask 236 is formed and patterned on nitride layer 234 to expose the portion of nitride layer 232 that is formed over first substrate region 216.

Figure 2G:
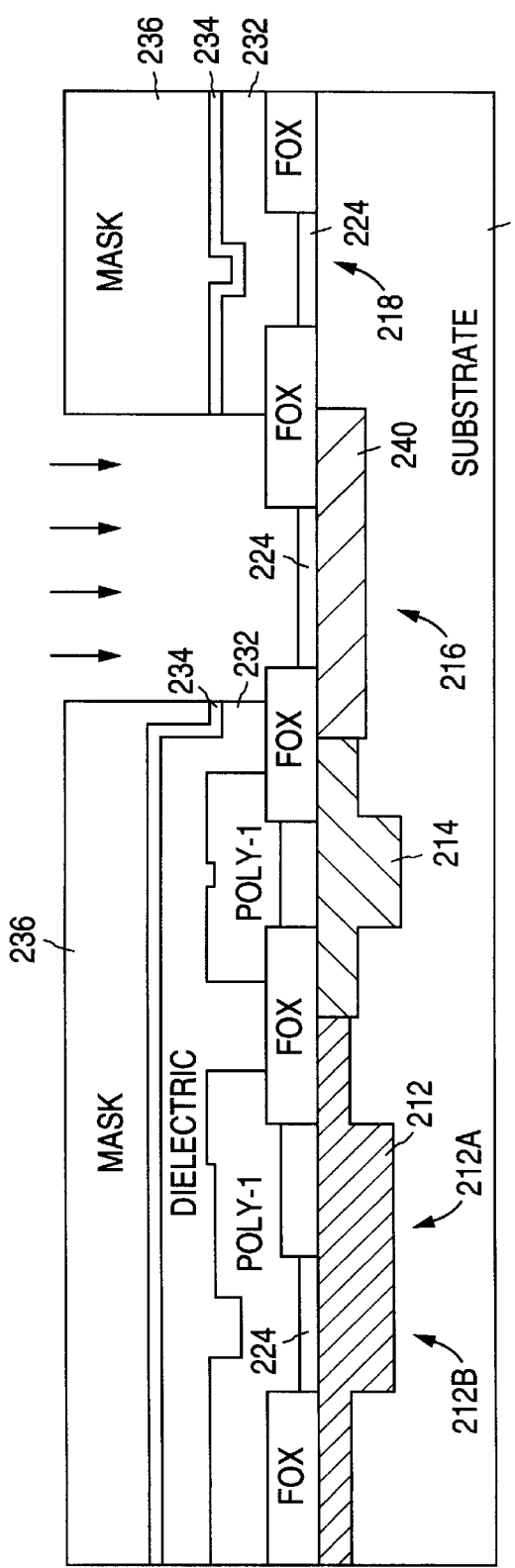

Following this, as shown in FIG. 2G, nitride layer 234 and dielectric layer 232 in region 216 are removed. Nitride layer 234 and dielectric layer 232 may be etched with a single etch recipe that includes fluorine. Once dielectric layer 232 has been removed, region 216 is implanted with a p-type dopant to form a low-voltage p-well 240.

Following the formation of p-well 240, a p-type dopant is optionally implanted into p-well 240 to form a punchthrough prevention region (not shown) below the surface of p-well 240. Next, a p-type dopant is again implanted into p-well 240 to set the threshold voltages of the to-be-formed low-voltage n-channel transistors.

The implant energy and dose ranges of the above implants are the same as those used with p-well 142. Once the threshold voltages of the low-voltage n-channel transistors have been set, mask 236 is removed.

Next, as shown in FIG. 2H, a second well mask 244 is formed on nitride layer 234 and tunnel oxide layer 224 to expose the portion of nitride layer 234 that is formed over second substrate region 218. Following this, nitride layer 234 and dielectric layer 232 in region 218 are removed. Once dielectric layer 232 has been removed, region 218 is implanted with a n-type dopant to form a low-voltage n-well 250.

Following the formation of n-well 250, a n-type dopant is optionally implanted into n-well 250 to form a punchthrough prevention region (not shown) below the surface of n-well 250. Next, a n-type dopant is again implanted into n-well 250 to set the threshold voltages of the to-be-formed low-voltage p-channel transistors.

The implant energy and dose ranges of the above implants are the same as those used with n-well 134. Once the threshold voltages of the low-voltage p-channel transistors have been set, mask 244 is removed. The photoresist strip may be followed by an optional thermal drive-in step.

(Regions 216 and 218 may alternately be implanted through nitride layer 234, dielectric layer 232, and oxide layer 224, with layers 232 and 234 being removed prior to the removal of mask 244).

Once mask 244 has been removed, as shown in FIG. 2I, tunnel oxide layer 224 is removed from regions 216 and 218. To insure that all of the tunnel oxide layer 224 has been removed, wafer 200 is then cleaned.

One of the advantages of the present invention is that during this cleaning step, dielectric layer 232 is protected from damage by nitride layer 234. Following the cleaning step, a layer of low-voltage gate oxide 242 approximately 40–60 Å thick is formed over p-well 240 and n-well 250.

(As described above, the layer of tunnel oxide 224 formed over first and second substrate regions 216 and 218 is used as a sacrificial oxide layer during the implant steps that form wells 240 and 250. Optionally, mask 222 can be formed to protect the first and second substrate regions 216 and 218. In this case, the layer of gate oxide 220 originally formed over the first and second substrate regions 216 and 218 would be used as the sacrificial oxide layer during the implant steps that form wells 240 and 250.)

Next, a second layer of polysilicon (poly-2) 254 approximately 1,000–5,000 Å thick is formed on the exposed field oxide regions FOX, interpoly dielectric layer 232, and gate oxide layer 242. Poly-2 layer 254, which is utilized to form the control gates of the memory transistors and the gates of the low-voltage logic transistors, is then doped. (Optionally, poly-2 layer 254 may also be doped when the source and drain implants are performed).

Following this, a first definition mask 256 is formed and patterned on poly-2 layer 254 to initially define a stacked-gate memory transistor 260, a n-channel low-voltage transistor 262, and a p-channel low-voltage transistor 264.

Figure 2J:
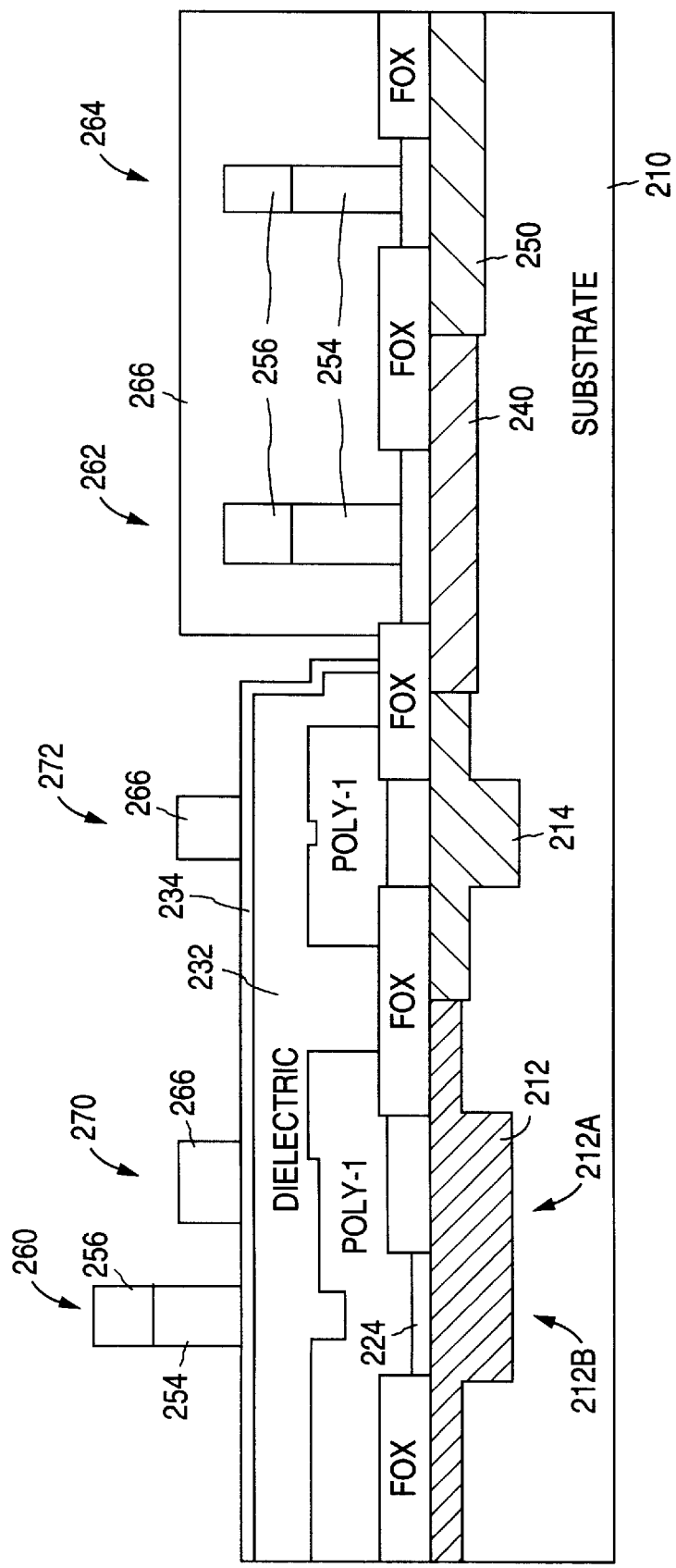

As shown in FIG. 2J, once mask 256 has been formed, the unmasked areas of poly-2 layer 254 are etched until the unmasked areas of poly-2 layer 254 have been removed. Poly-2 layer 254 may be etched with a single etch recipe that includes HBr. After this, mask 256 is hardened, and a second definition mask 266 is formed and patterned on nitride layer 234 to define a n-channel high-voltage transistor 270 and a p-channel high-voltage transistor 272, and to cover the initially-defined low-voltage transistors 262 and 264.

Figure 2K:
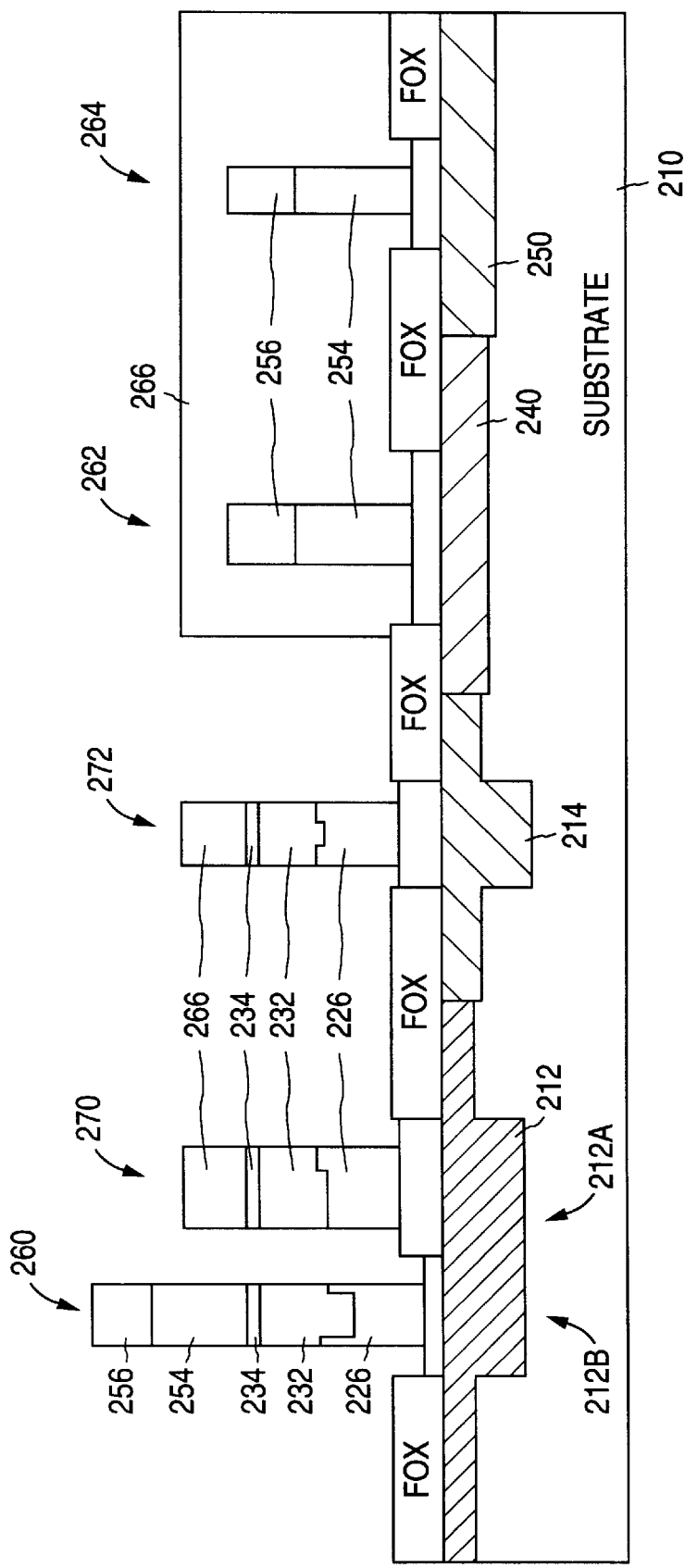

As shown in FIG. 2K, once mask 266 has been formed, the unmasked areas of nitride layer 234, dielectric layer 232 and poly-1 layer 226 are etched until the unmasked areas of nitride layer 234, dielectric layer 232, and poly-1 layer 226 have been removed. Each of these layers may be etched with a single etch recipe that includes HBr and fluorine. Following this, masks 256 and 266 are stripped.

Figure 2L:
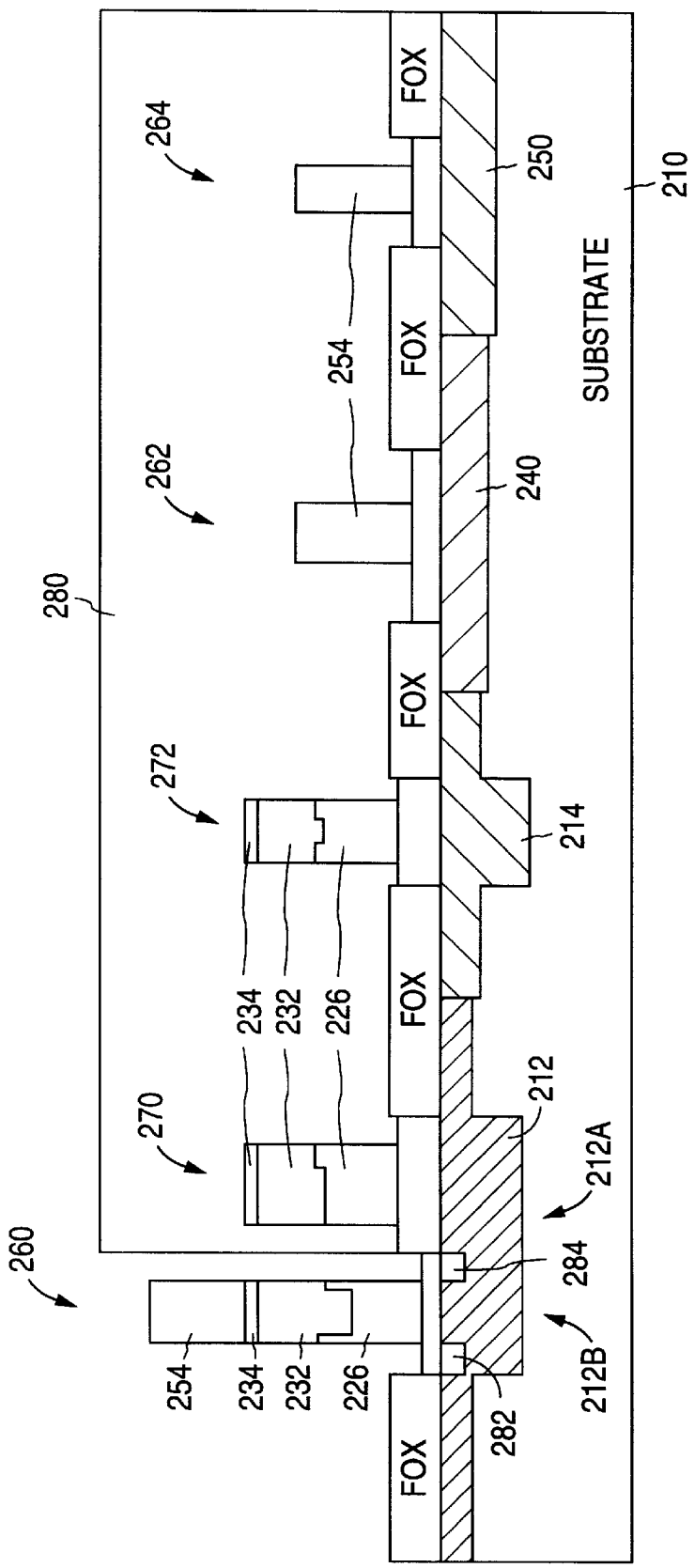

Next, as shown in FIG. 2L, a first cell implant mask 280 is formed and patterned to expose the portions of tunnel oxide layer 224 that are formed over array area 212B and may, alternately, also expose some or all of the portions of gate oxide layer 220 that are formed over p-well 212.

Following this, array area 212B is implanted with arsenic to form source and drain regions 282 and 284. (This implant step may also be used to dope the portion of poly-2 layer 254 that forms the control gate of initially-defined memory transistor 260). After this, mask 280 is removed.

Next, a layer of LDD screen oxide (not shown) approximately 100 Å thick is grown. After this, conventional steps are followed. The layer of screen oxide is typically employed in a standard CMOS flow to de-channel the LDD implants.

Due to the high N+ doping levels introduced in the cell area 212B, the control gate, the floating gate, and the source and drain regions of the memory transistor will be coated with a much thicker oxide (approximately 2× greater) than will the gates and source and drain regions of the initially-defined low-voltage transistors 260 and 262. This doping induced difference in the screen oxide thickness is used (in conjunction with nitride spacer technology) to prevent salicide from being formed on the control gates and the source and drain regions of the memory transistors.

One of the advantages of the present invention is that many of the fabrication steps that are unique to the formation of the memory cells and the high-voltage transistors are completed prior to the fabrication of the low-voltage transistors.

Thus, the present invention allows memory cells, high-voltage CMOS transistors, and low-voltage, deep sub-micron CMOS transistors to be formed on the same substrate such that the device parameters of the low-voltage transistors are the same regardless of whether the memory cells and high-voltage transistors are formed with the low-voltage transistors.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming a semiconductor device on a semiconductor wafer, the wafer having:

a substrate;

a first well formed in the substrate, the first well having a first area, a second area, and a conductivity type; and a second well formed in the substrate, the second well being spaced apart from the first well, and having a conductivity type which is different from the conductivity type of the first well;

the method comprising the steps of:

forming a layer of first gate oxide over the first area of the first well, and the second well;

forming a layer of tunnel oxide over the second area of the first well after the layer of first gate oxide has been formed;

forming a layer of first polysilicon (poly-1) over the layer of tunnel oxide and the layer of first gate oxide;

forming a layer of interpoly dielectric over the layer of poly-1;

forming a layer of nitride over the layer of interpoly dielectric;

forming a third well in the substrate after the layer of nitride has been formed, the third well being spaced apart from the first and second wells, and having a conductivity type;

forming a fourth well in the substrate after the layer of nitride has been formed, the fourth well being spaced apart from the first, second, and third wells, and having a conductivity type which is different from the conductivity type of the third well;

forming a layer of second gate oxide over the third and fourth wells; and forming a layer of second polysilicon (poly-2) over the layer of nitride and the layer of second gate oxide.

2. The method of claim 1 wherein the wafer further includes a first substrate region and a second substrate region.

3. The method of claim 2 wherein the layer of first gate oxide is formed over the second area of the first well, the first substrate region, and the second substrate region.

4. The method of claim 3 wherein the forming a layer of tunnel oxide step includes:

removing the layer of first gate oxide formed over the second area of the first well to expose a top surface of the second area of the first well; and forming the layer of tunnel oxide on the top surface of the first area of the first well.

5. The method of claim 3 wherein the forming a layer of tunnel oxide step includes:

removing the layer of first gate oxide from the second area of the first well to expose a surface of the second area of the first well, the first substrate region to expose a surface of the first substrate region, and the second substrate region to expose a surface of the second substrate region; and forming the layer of tunnel oxide on the surface of the first area of the first well, the surface of the first substrate region, and the surface of the second substrate region.

6. The method of claim 2 wherein the forming a layer of poly-1 step forms the layer of poly-1 on an oxide layer which is formed on the first and second substrate regions.

7. The method of claim 6 wherein the forming a layer of interpoly dielectric step includes:

removing the layer of poly-1 from over the first and second substrate regions; and forming the layer of interpoly dielectric on the layer of poly-1, and on the oxide layer formed on the first and second substrate regions.

8. The method of claim 7 wherein the forming a third well step includes:

removing the layer of nitride and the layer of interpoly dielectric from the first substrate region; and implanting the first substrate region to form the third well.

9. The method of claim 7 wherein the forming a fourth well step includes:

removing the layer of nitride and the layer of interpoly dielectric from the second substrate region; and implanting the second substrate region to form the fourth well.

10. The method of claim 1 and further comprising the steps of:

removing the layer of poly-2 formed over the first area of the first well, and the second well; and selectively removing the layer of poly-2 formed over the second area of the first well to form a control gate, the first substrate region to form a first gate, and the second substrate region to form a second gate.

11. The method of claim 10 and further comprising the steps of:

selectively removing the layer of nitride, the layer of interpoly dielectric, and the layer of poly-1 formed over the first and second wells to form a gate over the first area of the first well, a stacked-gate structure over the second area of the first well, and a gate over the second well.

12. A method for forming a semiconductor device on a semiconductor wafer, the wafer having:

a substrate;

a first well formed in the substrate, the first well having a first area, a second area, and a conductivity type;

a second well formed in the substrate, the second well being spaced apart from the first well, and having a conductivity type which is different from the conductivity type of the first well;

a first substrate region; and a second substrate region, the method comprising the steps of:

forming a layer of first gate oxide over the first and second wells, and the first and second substrate regions;

removing the layer of first gate oxide formed over the second area of the first well, and the first and second substrate regions;

forming a layer of tunnel oxide over the second area of the first well, and the first and second substrate regions;

forming a layer of first polysilicon (poly-1) over the layer of first gate oxide and the layer of tunnel oxide;

removing the poly-1 layer from the first and second substrate regions;

forming a layer of interpoly dielectric over the poly-1 layer and the layer of tunnel oxide in the first and second substrate regions;

forming a layer of nitride over the layer of interpoly dielectric;

removing the layer of nitride and the layer of interpoly dielectric from the first substrate region;

implanting the first substrate region to form a third well, the third well being spaced apart from the first and second wells and having a conductivity type;

removing the layer of tunnel oxide from the first substrate region;

forming a layer of second gate oxide over the third well after the layer of tunnel oxide has been removed from the first substrate region;

removing the layer of nitride and the layer of interpoly dielectric from the second substrate region;

implanting the second substrate region to form a fourth well, the fourth well being spaced apart from the first, second, and third wells, and having a conductivity type which is different from the conductivity type of the third well;

removing the layer of tunnel oxide from the second substrate region;

forming the layer of second gate oxide over the fourth well after the layer of tunnel oxide has been removed from the second substrate region; and forming a layer of second polysilicon (poly-2) over the layer of interpoly dielectric and the layer of second gate oxide.

\* \* \* \* \*